United States Patent [19]

Bendik et al.

[11] Patent Number: 5,591,678
[45] Date of Patent: Jan. 7, 1997

[54] PROCESS OF MANUFACTURING A MICROELECTRIC DEVICE USING A REMOVABLE SUPPORT SUBSTRATE AND ETCH-STOP

[75] Inventors: Joseph J. Bendik, Carlsbad; Gerard T. Malloy, Oceanside; Ronald M. Finnila, Carlsbad, all of Calif.

[73] Assignee: HE Holdings, Inc., Los Angeles, Calif.

[21] Appl. No.: 482,172

[22] Filed: Jun. 7, 1995

Related U.S. Application Data

[63] Continuation of Ser. No. 6,120, Jan. 19, 1993, abandoned.

[51] Int. Cl.[6] .......................... H01L 21/283; H01L 21/56; H01L 21/58; H01L 21/60

[52] U.S. Cl. .......................... 437/208; 437/974; 437/915; 148/DIG. 135; 148/DIG. 150; 156/662.1; 156/630.1

[58] Field of Search ............................ 437/208, 974, 437/915; 148/DIG. 135, DIG. 150; 156/630, 662, 901

[56] References Cited

U.S. PATENT DOCUMENTS

| | | | |
|---|---|---|---|
| 3,332,137 | 7/1967 | Kenney | 29/423 |
| 3,623,219 | 10/1969 | Stoller et al. | 437/974 |
| 4,131,909 | 12/1978 | Matsuda et al. | 437/974 |
| 4,169,000 | 9/1979 | Riseman | 156/662 |
| 4,467,340 | 8/1984 | Rode et al. | 250/370.08 |
| 4,612,083 | 9/1986 | Yasumoto et al. | 437/208 |
| 4,670,653 | 6/1987 | McConkle et al. | 250/370.08 |
| 4,783,594 | 11/1988 | Schulte et al. | 257/446 |
| 4,815,208 | 3/1989 | Raschke | 437/209 |
| 4,829,018 | 5/1989 | Wahlstrom | 148/DIG. 135 |
| 4,943,491 | 7/1990 | Norton et al. | 250/370.13 |
| 4,980,308 | 12/1990 | Hayashi et al. | 437/974 |
| 5,024,723 | 6/1991 | Goesele et al. | 156/662 |
| 5,034,343 | 6/1991 | Rouse et al. | 437/974 |
| 5,043,582 | 8/1991 | Cox et al. | 250/370.09 |
| 5,179,283 | 1/1993 | Cockrum et al. | 250/352 |
| 5,182,624 | 1/1993 | Tran | 257/40 |
| 5,227,656 | 7/1993 | Timlin | 257/441 |

FOREIGN PATENT DOCUMENTS

| | | |
|---|---|---|
| 0371862 | 6/1990 | European Pat. Off. |
| 63-308970 | 12/1988 | Japan |

OTHER PUBLICATIONS

Liu, C. N., "Matching the Thermal Coefficients of Expansion of Chips to Module Substrate", IBM Technical Disclosure Bulletin, vol. 19, No. 12, May 1977.

Patent Abstracts of Japan, vol. 13, No. 270 (E–776), 8 Mar. 1989 and Jap,A,01,061 056 (NEC Corp).

Hayashi, Y., et al. "CUBIC (Cumulatively Bonded IC) Devices Stacking Thin Film Dual–CMOS Functional Blocks", NEC Corporation, Kanagawa, Japan, in Semiconductor Internationa, Dec. 1991.

Patent Abstracts of Japan, vol. 16, No. 79 (E–1171) 26 Feb. 1992 and JP,A,03 266 478 (Fujitsu).

*Primary Examiner*—John Niebling
*Assistant Examiner*—David E. Graybill
*Attorney, Agent, or Firm*—W. C. Schubert; W. K. Denson-Low

[57] ABSTRACT

A microelectronic device is fabricated by furnishing a first substrate (40) having a silicon etchable layer (42), a silicon dioxide etch-stop layer (44) overlying the silicon layer (42), and a single-crystal silicon wafer (46) overlying the etch-stop layer (44), the wafer (46) having a front surface (52) not contacting the etch stop layer (44). A microelectronic circuit element (50) is formed in the single-crystal silicon wafer (46). The method further includes attaching the front surface (52) of the single-crystal silicon wafer (46) to a second substrate (58), and etching away the silicon layer (42) of the first substrate (40) down to the etch-stop layer (44). The second substrate (58) may also have a microelectronic circuit element (58') therein that can be electrically interconnected to the microelectronic circuit element (50).

18 Claims, 2 Drawing Sheets

PROCESS OF MANUFACTURING A MICROELECTRIC DEVICE USING A REMOVABLE SUPPORT SUBSTRATE AND ETCH-STOP

This is a continuation of application Ser. No. 006,120 filed Jan. 19, 1993, now abandoned.

BACKGROUND OF THE INVENTION

This invention relates to microelectronic devices, and, more particularly, to a microelectronic device that is moved from one support to another support during fabrication.

Microelectronic devices are normally prepared by a series of steps such as patterning, deposition, implantation, growth, and etching that build up an electronic circuit on or near the top surface of a thin substrate wafer. Interconnection pads are placed on the surface of the wafer to provide connections to external leads or to other microelectronic devices. Such a microelectronic device is considered a two-dimensional structure in the plane of the substrate wafer. There are usually multiple layers of deposited conductors and insulators, but each layer is quite thin. Any height of the device in the third dimension perpendicular to the substrate surface is much less than the dimensions in the plane of the substrate wafer, and is often no more than a few thousand Angstroms.

The microelectronic devices or arrays of such devices are usually placed inside a protective housing called a package, with leads or connection pads extending out of the package. When the microelectronic devices are used, a number of the packages with their contained microelectronic devices are normally affixed to a base such as a phenolic plastic board. Wires are run between the various devices to interconnect them. There may be metallic traces imprinted onto the base to provide common power, ground, and bus connections, and the base itself has external connections. Such boards with a number of interconnected devices are commonly found inside both consumer and military electronics equipment. For example, an entire microcomputer may be assembled as a number of microelectronic devices such as a processor, memory, and peripheral device controllers mounted onto a single board.

The present inventors have determined that for some applications it would be desirable to stack and interconnect a number of such two-dimensional microelectronic devices, fabricated on a substrate wafer, one on top of the other to form a three-dimensional device. The stack might also include other circuit elements such as interconnect layers and thin film sensors as well. To interconnect the stacked wafers using leads that extend from the pads on the top of one wafer to the pads on the top of another wafer, around the sides of the wafers, or using plug interconnects or the like, would be clumsy, space consuming, and impossible to do for the case of highly complex circuitry requiring many interconnects.

In considering fabrication techniques to produce such three-dimensional, stacked devices, the fragility of the devices is a concern. The individual substrate wafers and their microelectronic circuitry are usually made of fragile semiconductor materials, chosen for their electronic characteristics rather than their strength or fracture resistance. The selected fabrication technique cannot damage the circuitry that has already been placed onto the substrate wafer.

Thus, there is a need for a method to fabricate three-dimensional microelectronic devices using stacked substrate wafers with circuitry already on them. The present invention fulfills this need, and further provides related advantages.

SUMMARY OF THE INVENTION

The present invention provides an approach for fabricating microelectronic devices that permits three-dimensional manipulations and fabrication steps with two-dimensional devices already deposited upon a wafer substrate. The invention permits microelectronic devices to be prepared using well-established, inexpensive thin-film deposition, etching, and patterning techniques, and then to be further processed singly or in combination with other such devices, into more complex devices.

In accordance with the invention, a method of fabricating a microelectronic device comprises the steps of furnishing a first substrate having an etchable layer, an etch-stop layer overlying the etchable layer, and a wafer overlying the etch-stop layer, and forming a microelectronic circuit element in the wafer of the first substrate. The method further includes attaching the wafer portion of the first substrate to a second substrate, and etching away the etchable layer of the first substrate down to the etch-stop layer. The second substrate may include a microelectronic device, and the procedure may include the further step of interconnecting the microelectronic device on the first substrate with the microelectronic device on the second substrate.

In a typical application, the "back side" etch-stop layer is patterned, and an electrical connection to the microelectronic circuit element on the wafer is formed through the etch-stop layer. This technique permits access to the microelectronic circuit element from the back side. Electronic connections can therefore be made directly to the back side of the wafer layer, and indirectly to the front side microelectronic circuit element by opening access to front-side interconnects from the back side. Such an ability to achieve electronic access can be valuable for some two-dimensional devices, and also permits multiple two-dimensional devices to be stacked one above the other to form three-dimensional devices by using techniques such as indium bumps to form interconnections between the stacked devices.

In a preferred approach to practicing the invention, a method of fabricating a microelectronic device comprises the steps of furnishing a first substrate having a silicon etchable layer, a silicon dioxide etch-stop layer overlying the silicon layer, and a single-crystal silicon wafer overlying the etch-stop layer. The wafer has a front surface not contacting the silicon dioxide layer. A microelectronic circuit element is formed in the single-crystal silicon wafer on or through the front surface. The method further includes attaching the front surface of the single-crystal silicon wafer to a first side of a second substrate, and etching away the silicon etchable layer of the first substrate down to the silicon dioxide etch-stop layer using an etchant that attacks the silicon layer but not the silicon dioxide layer. As discussed previously, the silicon dioxide layer may then be patterned and connections formed therethrough.

The present approach is based upon the ability to transfer a thin film microelectronic circuit element or device from one substrate structure to another substrate structure. The circuit element usually is fabricated with a relatively thick first substrate that provides support during initial fabrication and handling. However, it is difficult to achieve electrical connections through such a thick substrate, because of the difficulty in locating deep, through-support vias precisely at the required point, the difficulty in insulating the walls of deep vias, and the difficulty in filling a deep via with conducting material. The first substrate cannot simply be removed to permit access to the bottom side of the electrical circuit element, as the assembly could not be handled in that very thin form.

In the present approach, after initial circuit element fabrication on a first substrate structure, the electrical circuit element is transferred to a second substrate structure. (If the second substrate itself contains another microelectronic circuit element, interconnections between the two microelectronic circuit elements are made at this point, as by using an indium-bump technique/epoxy technique.) With the circuit element thus supported, the etchable portion of the first substrate is removed by etching, down to the etch-stop layer. The terms "etchable" and "etch-stop" are used herein relative to a specific selected etchant. There is chosen an etchant that readily etches the etchable layer but has a much lower etching rate for the etch-stop layer. It is understood, however, that the etch-stop layer may be generally or selectively etched by yet other techniques, after the etchable layer is removed.

Once the etchable layer is removed, the relatively thin etch-stop layer may be patterned and through-etched to provide access to the microelectronic circuit element, including its connection pads, through the etch-stop layer. Many alternative approaches are possible. For example, the two-dimensional structure may be used with direct back connections and indirect front connections. The additional surface area on the bottom of the etch-stop layer provides space for deposition of interconnection metallization traces. The two-dimensional structure may be stacked with other two-dimensional structures to form a three-dimensional structure. Further circuitry could be deposited upon the back side of the etch-stop layer, as needed and permitted by constraints imposed by the front-side circuit element structure.

Thus, the present approach provides a highly flexible approach to the fabrication of complex microelectronic devices using a building-block approach. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
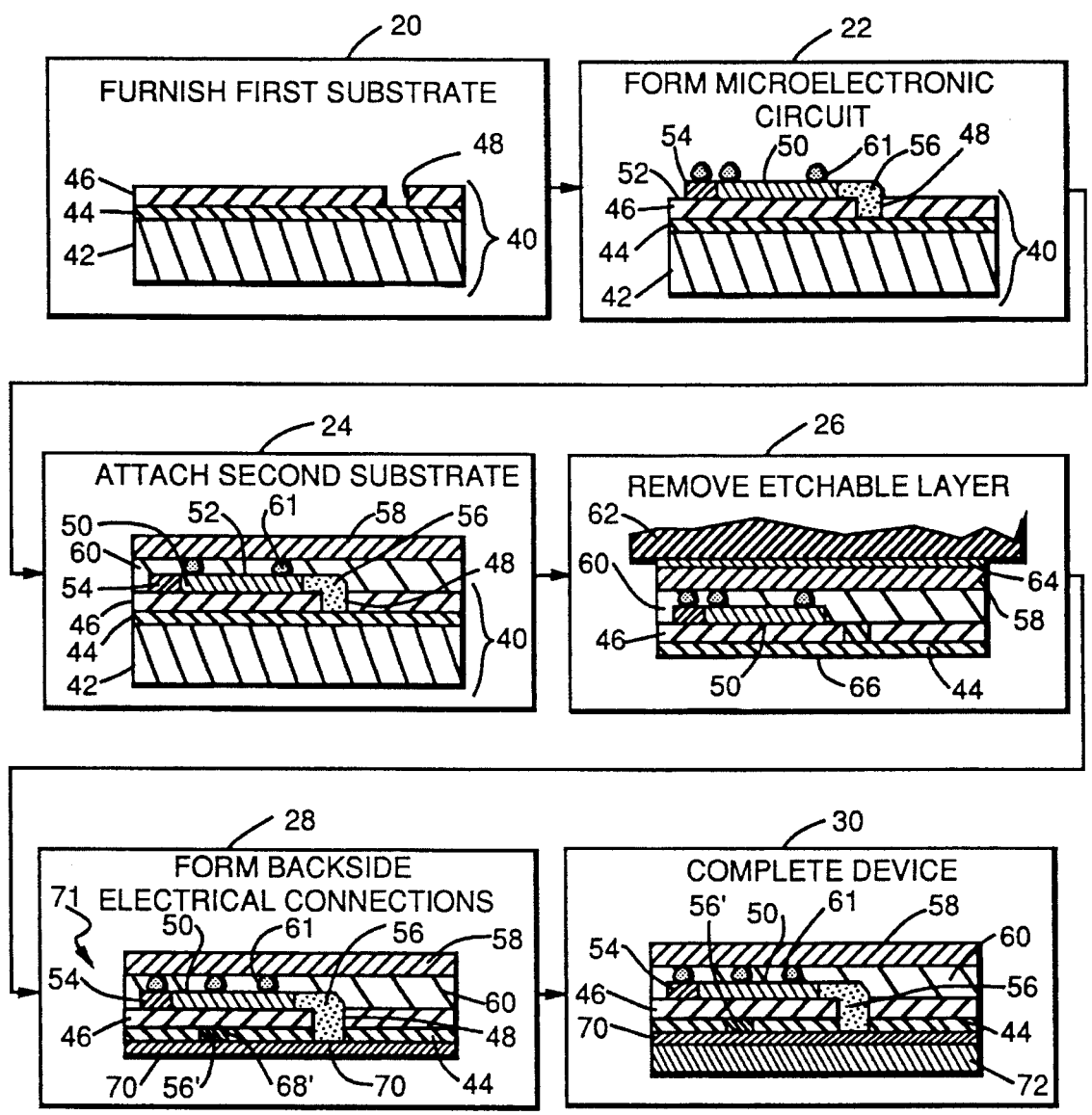
FIG. 1 is a diagrammatic process flow diagram for the approach of the invention, with the structure at each stage of fabrication indicated schematically.

Referring to FIG. 1, the present invention is practiced by first providing a first substrate 40, numeral 20. The first substrate 40 includes an etchable layer 42, an etch-stop layer 44 grown upon and overlying the etchable layer 42, and a wafer layer 46 bonded to and overlying the etch-stop layer 44. Such substrates can be purchased commercially.

In the preferred practice, the etchable layer 42 is a layer of bulk silicon about 500 micrometers thick and the etch-stop layer 44 is a layer of silicon dioxide about 1 micrometer thick. The wafer layer 46 is normally thicker than required when it is bonded to the etch stop layer 44, and is thinned to the required final thickness. A typical thinning process involves lapping followed by a chem-mechanical polish. Preferably, the wafer layer 46 is a layer of single crystal silicon initially about 500 micrometers thick which becomes, after thinning, about 30 nanometers to 50 micrometers thick. These dimensions are not critical, and may be varied as necessary for particular applications. (The structure depictions In FIGS. 1–4 are not drawn to scale.) The wafer layer 45 may also be or include an interconnect material such as a metal or other structure as may be appropriate for a particular application. In the present case, an optional via opening 48 is provided through the wafer layer 46. The use of this via 48 will become apparent from subsequent discussions.

The first substrate 40 is prepared by applying well-known microelectronic techniques. The silicon dioxide etch-stop layer 44 is produced on a bulk silicon piece 42 by heating it in an oxygen-hydrogen atmosphere at a temperature of about 1100° C. for a time sufficient to achieve the desired thickness, typically about 2 hours. The wafer layer 46 is either deposited directly upon the etch-stop layer 44 or fabricated separately and bonded to the etch-stop layer 46 by direct interdiffusion, preferably the latter, and thinned. The via 48 is produced by standard patterning and etching techniques. (All references herein to "standard" or "well known" techniques, or the like, mean that individual process steps are known generally, not that they are known in the present context or combination, or to produce the present type of structure.)

A microelectronic circuit element 50 is formed in the wafer layer 46, numeral 22, working from a front exposed side 52. The microelectronic circuit element 50 may be of any type, and may itself include multiple layers of metals, semiconductors, insulators, etc. Any combination of steps can be used, including, for example, deposition, implantation, film growth, etching, and patterning steps. As used herein, the term "microelectronic circuit element" is to be interpreted broadly, and can include active devices and passive structure. For example, the microelectronic circuit element 50 can include many active devices such as transistors. Alternatively, it may be simply a patterned electrical conductor layer that is used as an interconnect between other layers of structure in a stacked three-dimensional device, or may be a sensor element.

An important virtue of the present invention is that it is operable with a wide range of microelectronic circuit elements 50, and therefore the present invention is not limited to any particular circuit element 50. In the presently preferred case, the first substrate 40 is silicon based, and therefore the microelectronic circuit element 50 is preferably a silicon-based device. Where the microelectronic circuit element 50 is based upon other material systems, it may be preferred for the first substrate to be made of a material compatible to that material system. In this usage, "compatible" means that the first substrate permits fabrication of the microelectronic circuit element 50 therein.

As it is illustrated in FIG. 1, the microelectronic circuit element 50 includes two types of electrical interconnects. A front-side electrical interconnect 54 permits direct electrical interconnection to the microelectronic circuit element 50 from "above", and back-side electrical interconnects 55 and 55' permit indirect front-side electrical interconnection to the microelectronic circuit element 50 and direct back-side electrical interconnection to the wafer layer 46 from "below", respectively. The front-side electrical interconnect 54 is a metallic pad, and the back-side electrical interconnects 56 and 56' are each an electrical conductor such as polysilicon or a metal deposited into the via 48. The interconnect 54 is formed during the fabrication of the microelectronic circuit element 50, and the interconnects 56 and 56' are formed by opening vias through the back side and filling them with an electrical conductor, all well-known techniques.

A second substrate 58 is attached to the structure on the side corresponding to the front surface 52, numeral 24. That is, the second substrate 58 is on the opposite side of the microelectronic circuit element 50 from the first substrate 40. The second substrate 58 may be any suitable material, such as silicon or aluminum oxide (specifically sapphire). The second substrate may optionally include a microelectronic device deposited therein. (The illustration of FIG. 1 does not show the structure of the second substrate 58 in detail to conserve space. That structure is presented in more detail in FIGS. 2 and 3, and will be discussed subsequently.) If the selected material of the second substrate or any devices therein may be attacked by the etchant used in the subsequent etching, it must be temporarily protected during etching by a base in the manner to be described.

The second substrate 58 is attached by any appropriate technique, which must be chosen so that the attachment procedure does not damage the pre-existing structure such as the microelectronic circuit element 50. In one approach that achieves a permanent attachment, the second substrate 58 is attached by a layer of epoxy 60 placed between the pre-existing structure and the second substrate 58, and thereafter degassed in a vacuum and cured. The epoxy is resistant to chemical attack in the etchant used in a subsequent step. To attain precise alignment, tooling may be used to position the structures to be joined. Interconnects such as indium bumps 61 can be placed on the front-side electrical contacts 54 to achieve electrical interconnection between the microelectronic circuit element 50 and any microelectronic circuit element in the second substrate 58.

The etchable layer 42 of the first substrate 40 is removed by an appropriate technique, preferably by etching, numeral 26. To protect the structure against etch attack, it may be temporarily attached to a base 62 such as a piece of aluminum oxide, preferably sapphire, by a layer of wax 64. After etching, the wax 64 is melted and the etched structure removed from the base 62.

The etchant is chosen so that it attacks the etchable layer 42 relatively rapidly, but the etch-stop layer 44 relatively slowly or not at all. The terms "etchable" and "etch-stop" indicate a relative relation to each other in a particular etchant, as used herein. They are relative to each other and to the selected etchant. Thus, the preferred bulk silicon etchable layer 42 is attacked and etched away by a 5–10 molar potassium hydroxide (KOH) or sodium hydroxide (NaOH) solution at a temperature of 60° C. The etch-stop silicon dioxide layer 44 is attacked by the potassium hydroxide or sodium hydroxide solution at a much lower rate than the etchable layer 42. Waxes such as glycol phthalate are softened by the potassium hydroxide or sodium hydroxide solution only very slowly, and can be used to bond the base 62 to the structure for protection. When the etchable layer 42 is exposed to the etchant, bubbles evolve as the silicon reacts and etches away. The end point of the bulk etching is determined by the end of the bubble evolution and the appearance of the glassy silicon dioxide etch-stop layer 44.

At the completion of etching a back face 66 of the etch-stop layer 44 is exposed, as depicted in the step 26. The base 62 may be removed by melting the wax 64, or it may be left as a convenience in subsequent operations. Eventually, however, the base 62 is removed at some point in the process.

Back-side electrical connections are formed through the etch-stop layer 44 (for direct back-side interconnects 56') and through the etch stop layer 44 and the wafer layer 45 to the microelectronic circuit element 50 (for indirect front-side interconnects 96), as shown at numeral 28. To form such connections, the etch-stop layer 44 is patterned by well-known patterning techniques to precisely identify the location to be penetrated. Material is removed from these locations of the etch-stop layer 44 by any appropriate method. As discussed earlier, the term "etch-stop" is used relative to the etchant used to remove the etchable layer 42. There are other etches that can be used to etch openings through the etch-stop layer 44. In the case of the preferred silicon dioxide etch-stop layer 44, a hydrofluoric acid-based etchant such as a mixture of hydrofluoric acid and ammonium fluoride is used after patterning to etch openings 68 and 68' through the etch-stop layer 44. Dry etching techniques such as plasma etching can also be used.

The via 68 extends through the etch-stop layer 44 and the wafer layer 46 to the microelectronic circuit element 50. When filled with an electrical conductor such as a metal, it provides an indirect back-side electrical connection to the microelectronic circuit element 50. Alternatively, the via may be extended through the etch-stop layer 44 to (but not through) the wafer layer 46, as shown at numeral 68'. This via 68', when filled with an electrical conductor, provides the direct back-side electrical connection 56' to the wafer layer 46. In some electronic devices, It is desirable to apply a voltage to the either or both sides of the active element for biasing purposes. The direct back-side electrical connection 56' permits biasing of one side of the active element, while the indirect front-side electrical connection 56 permits biasing of the other side of the active element.

An electrical conductor layer 70 may be deposited overlying the etch-stop layer 44 and the back-side electrical connections 56 and 56', and patterned. The electrical conductor material is preferably a metal such as aluminum. Electrical interconnection to the back-side electrical connections 56 and 56' is thereby accomplished.

This final structure 71, with front and back side electrical connections, is useful by itself, or it may be used in many other contexts. In one possible application, another microelectronic device 72 is integrally Joined to the back side of the structure 71. The device 72 is aligned so that it makes electrical contacts to the microelectronic circuit element 50 through the electrical conductor layer 70. The three-dimensional structure 71, 72 made by this approach is depicted in greater detail in FIG. 2.

Figure 2:
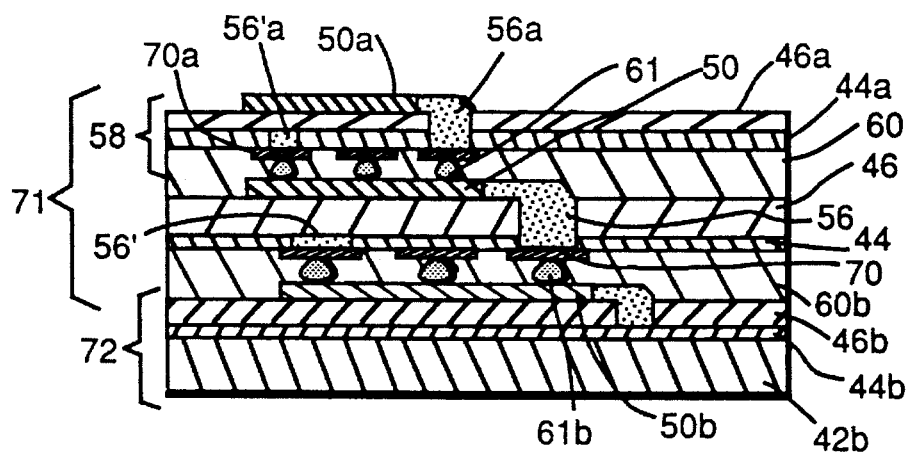
FIG. 2 is a schematic side sectional view of a microelectronic device structure prepared according to the procedure of FIG. 1.

Referring to FIG. 2, the structure 71 is prepared as discussed in relation to the method of FIG. 1. It includes the microelectronic circuit element 50, back-side electronic connections 56 and 55', and indium bumps 61, as well as the wafer layer 46, the etch-stop layer 44, and the electrically conducting layer 70. The second substrate 58, previously shown in FIG. 1 without its detailed structure, includes a microelectronic circuit element 50a fabricated in a wafer layer 46a, which in turn overlies an etch-stop layer 44a.

Back-side electrical connections 56a and 56'a connect with an electrically conducting layer 70a. The layer 70a in turn is in electrical communication with the microelectronic device 50 through the indium bumps 61.

The device 72, shown in FIG. 1 without its detailed structure, includes a microelectronic circuit element 50b fabricated in a wafer layer 46b, which overlies an etch-stop layer 44b. As depicted in FIG. 2, an etchable layer 42b of the device 72 is still present to provide strength to the stack. The device 72 is joined to the device structure 71 with an epoxy layer 60b.

The structure of FIG. 2 thus has three microelectronic circuit elements 50, 50a, and 50b interconnected in a three-dimensional array. The process of building up a three-dimensional stack of devices can continue indefinitely by adding additional microelectronic circuit elements "below" the device 72. To further process the device of FIG. 2, process steps 26, and 28 of FIG. 1 are repeated for the device 72. The etchable layer 42b is removed, and indirect back-side electrical connections 56b (and optionally direct back-side electrical connections) can be added in the manner discussed earlier. In electrical conduction layer 70b is deposited and patterned.

Figure 3:
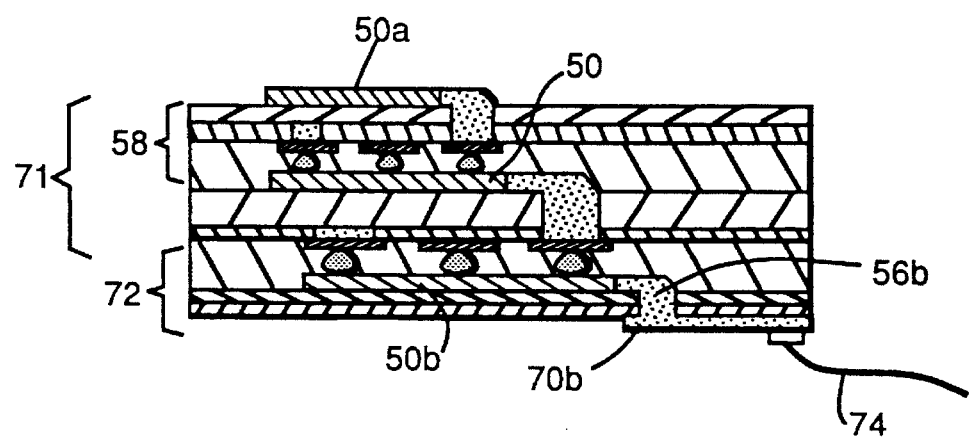
FIG. 3 is a schematic side elevational view of a three-dimensional microelectronic device built from two-dimensional devices using the present approach.

FIG. 3 depicts the results of repeating process steps 26 and 28. At this point, yet another microelectronic device structure could be affixed with an epoxy layer below the device 72, and electrically interconnected through the back-side electrical connections. Rather than depict such a structure, FIG. 3 shows the manner of external electrical connections. To achieve an external electrical interconnect, a lead 74 is wire bonded to a pad region of the electrical conduction layer 70b.

Thus, the structures depicted in FIGS. 2 and 3 provide integrated three-dimensional microelectronic device structures made from two-dimensional circuit elements, with internal and external electrical interconnections. These structures are normally packaged with conventional procedures.

Figure 4:
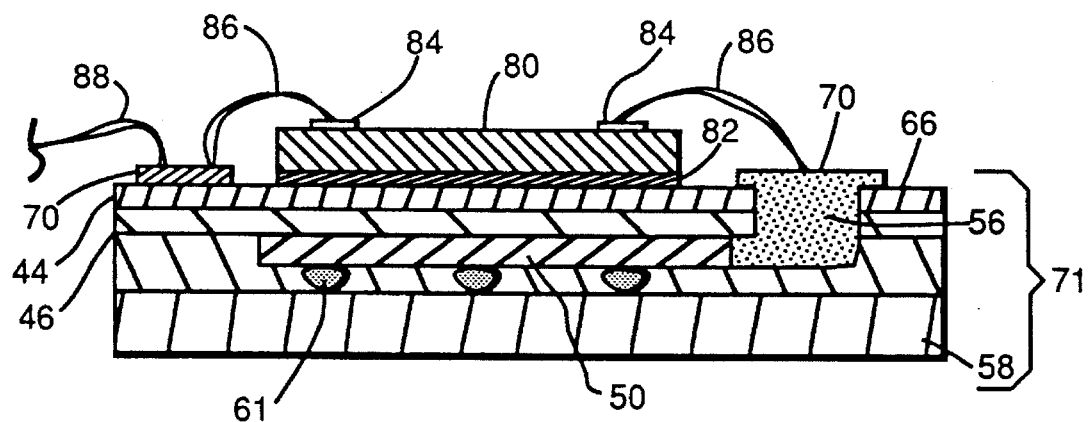
FIG. 4 is a schematic side elevational view of a "smart board" configuration.

FIG. 4 depicts another use of the device structures prepared according to the present invention, as a "smart board" up on which other microelectronic components can be attached by wire-bonding techniques. The microelectronic device 71, shown in FIG. 4 in the form presented in FIG. 1 and inverted from the orientation of FIG. 1, is prepared at any level of complexity of three-dimensional structure as discussed in relation to FIGS. 2 and 3. A separately fabricated device 80 is attached to the back face 66 with an epoxy layer 82. Electrical interconnect pads 84 on the device 80 are connected to pad locations of the patterned electrically conducting layer 70 on the device 71 by wire-bonded leads 85. External connections are achieved through wire-bonded leads 88 to the patterned electrically conducting layer 70.

By this approach and with the structure of FIG. 4, the device 71 fabricated according to the approach of FIG. 1 can be used as a "smart board" containing microelectronic functions, for attachment of other devices 80. The device 80 is not electrically connected to the device 71 by indium bumps or similar technique, but instead is connected by wire bonding or a similar approach.

The present invention thus provides a highly flexible microelectronic fabrication technique. Three-dimensional, multilayer structures with arbitrarily many layers of microelectronic circuit elements can be fabricated with external connection points. These structures can be used as-is, or as the "smart board" for attachment of yet other devices.

Although a particular embodiment of the invention has been described in detail for purposes of illustration, various modifications may be made without departing from the spirit and scope of the invention. Accordingly, the invention is not to be limited except as by the appended claims.

What is claimed is:

1. A method of fabricating a microelectronic device, comprising the steps of:

furnishing a first substrate having an etchable layer, an etch-stop layer overlying the etchable layer, and a wafer overlying the etch-stop layer;

forming a microelectronic circuit element in the exposed side of the wafer of the first substrate opposite to the side overlying the etch-stop layer;

attaching the wafer of the first substrate to a second substrate; and etching away the etchable layer of the first substrate down to the etch-stop layer.

2. The method of claim 1, further including an additional step, after the step of etching, of patterning the etch-stop layer.

3. The method of claim 2, further including an additional step, after the step of patterning, of forming an electrical connection to the microelectronic circuit element through the patterned etch-stop layer and through the wafer.

4. The method of claim 2, further including an additional step, after the step of patterning, of forming an electrical connection to the wafer through the patterned etch-stop layer.

5. The method of claim 1, wherein the etchable layer is silicon, the etch-stop layer is silicon dioxide, and the wafer is single-crystal silicon.

6. The method of claim 1, wherein the second substrate contains a second microelectronic circuit element.

7. The method of claim 6, wherein the step of attaching includes the step of making an electrical contact from the microelectronic circuit element on the wafer of the first substrate to the second microelectronic circuit element on the second substrate.

8. The method of claim 1, wherein the step of attaching includes the steps of placing a layer of epoxy between the second substrate and the wafer portion of the first substrate, and degassing and curing the epoxy.

9. The method of claim 1, further including an additional step, after the step of attaching and before the step of etching, of fixing the second substrate to an etching support that is resistant to attack by an etchant.

10. The method of claim 1, wherein the step of etching includes the step of contacting the etchable layer to a liquid etchant that attacks the etchable layer rapidly and the etch-stop layer slowly.

11. A method of fabricating a microelectronic device, comprising the steps of:

furnishing a first substrate having an etchable layer, an etch-stop layer overlying the etchable layer, and a wafer overlying the etch-stop layer;

forming a microelectronic circuit element in the exposed side of the wafer of the first substrate opposite the side overlying the etch-stop layer;

attaching the wafer of the first substrate to a second substrate, the second substrate having a second microelectronic circuit element therein;

making an electrical contact from the microelectronic circuit element in the wafer of the first substrate to the second microelectronic circuit element on the second substrate; and etching away the etchable layer of the first substrate down to the etch-stop layer; and forming an electrical connection to the microelectronic circuit element in the wafer of the first substrate through the etch-stop layer.

12. The method of claim 11, wherein the etchable layer is silicon, the etch-stop layer is silicon dioxide, and the wafer is single-crystal silicon.

13. A method of fabricating a microelectronic device, comprising the steps of:

furnishing a first substrate having a silicon etchable layer, a silicon dioxide etch-stop layer overlying the silicon layer, and a single-crystal silicon wafer overlying the etch-stop layer, the wafer having a front surface not contacting the silicon dioxide layer;

forming a microelectronic circuit element in the front surface of the single-crystal silicon wafer;

attaching the front surface of the single-crystal silicon wafer to a first side of a second substrate; and etching away the silicon etchable layer down to the silicon dioxide etch-stop layer using an etchant that attacks the silicon layer but not the silicon dioxide layer.

14. The method of claim 13, further including an additional-step, after the step of etching, of patterning the etch-stop layer.

15. The method of claim 14, further including an additional step, after the step of patterning, of forming an electrical connection to the microelectronic circuit element through the patterned etch-stop layer and through the wafer.

16. The method of claim 14, further including an additional step, after the step of patterning, of forming an electrical connection to the wafer through the patterned etch-stop layer.

17. The method of claim 13, wherein the silicon etchable layer of the first substrate is about 500 micrometers in thickness, the silicon dioxide etch-stop layer of the first substrate is about 1 micrometer in thickness, and the wafer of the first substrate is from about 30 nanometers to about micrometers in thickness.

18. The method of claim 13, wherein the step of attaching includes the steps of placing a layer of epoxy between the second substrate and the front surface of the single-crystal silicon wafer, and degassing and curing the epoxy.

* * * * *